United States Patent
Lee et al.

(10) Patent No.: US 9,196,796 B2
(45) Date of Patent: Nov. 24, 2015

(54) SEMICONDUCTOR LIGHT EMITTING DIODE HAVING OHMIC ELECTRODE STRUCTURE AND METHOD OF MANUFACTURING THE SAME

(75) Inventors: Jong Lam Lee, Pohang-si (KR); Yang Hee Song, Seongnam-si (KR)

(73) Assignees: Seoul Viosys Co., Ltd., Ansan-si (KR); Postech Academy-Industry Foundation, Pohang-si (KR)

( * ) Notice: Subject to any disclaimer, the term of this patent is extended or adjusted under 35 U.S.C. 154(b) by 316 days.

(21) Appl. No.: 13/816,793

(22) PCT Filed: Aug. 9, 2011

(86) PCT No.: PCT/KR2011/005796
§ 371 (c)(1),
(2), (4) Date: Mar. 19, 2013

(87) PCT Pub. No.: WO2012/020968
PCT Pub. Date: Feb. 16, 2012

(65) Prior Publication Data
US 2013/0221324 A1    Aug. 29, 2013

(30) Foreign Application Priority Data
Aug. 13, 2010 (KR) ........................ 10-2010-0078115

(51) Int. Cl.
*H01L 33/30* (2010.01)
*H01L 33/42* (2010.01)
(Continued)

(52) U.S. Cl.
CPC ............ *H01L 33/40* (2013.01); *H01L 33/0095* (2013.01); *H01L 33/32* (2013.01); *H01L 33/405* (2013.01); *H01L 2933/0016* (2013.01)

(58) Field of Classification Search
CPC ...... H01L 33/025; H01L 33/40; H01L 33/325; H01L 2224/48091; H01L 2924/00014
USPC .......... 257/99, 94, E33.008, 76, E33.025, 44, 257/54, 734, 748, 81; 438/105
See application file for complete search history.

(56) References Cited

U.S. PATENT DOCUMENTS 6,507,041 B2    1/2003   Nakamura et al.
7,160,747 B2 *  1/2007   Haberern et al. ............... 438/39
(Continued)

FOREIGN PATENT DOCUMENTS

| CN | 1102507 | 5/1995 |
| CN | 1330416 | 1/2002 |

(Continued)

OTHER PUBLICATIONS

International Search Report issued to related International Application No. PCT/KR2011/005796 dated Mar. 27, 2012.
(Continued)

*Primary Examiner* — Mary Wilczewski
*Assistant Examiner* — Tsz Chiu
(74) *Attorney, Agent, or Firm* — H.C. Park & Associates, PLC

(57) ABSTRACT

Embodiments of the invention provide a semiconductor light emitting diode having an ohmic electrode structure, and a method of manufacturing the same. The semiconductor light emitting diode includes a light emitting structure having an upper surface constituting an N-face; and an ohmic electrode structure located on the light emitting structure. Here, the ohmic electrode structure includes a lower diffusion preventing layer, a contact layer, an upper diffusion preventing layer, and an Al protective layer from the N-face of the light emitting structure.

18 Claims, 4 Drawing Sheets

(51) Int. Cl.
*H01L 29/10* (2006.01)
*H01L 23/48* (2006.01)
*H01L 33/40* (2010.01)
*H01L 33/00* (2010.01)
*H01L 33/32* (2010.01)

(56) References Cited

U.S. PATENT DOCUMENTS

| | | | | |
|---|---|---|---|---|
| 7,525,122 | B2* | 4/2009 | Ring et al. | 257/76 |
| 8,916,871 | B2* | 12/2014 | Alvarez et al. | 257/44 |
| 2002/0096687 | A1* | 7/2002 | Kuo et al. | 257/99 |
| 2008/0230904 | A1 | 9/2008 | Lee | |
| 2008/0315419 | A1* | 12/2008 | Gaska et al. | 257/751 |
| 2010/0289042 | A1* | 11/2010 | Tamura et al. | 257/94 |
| 2013/0221406 | A1* | 8/2013 | Gaska et al. | 257/191 |
| 2014/0070226 | A1* | 3/2014 | Alvarez et al. | 257/76 |

FOREIGN PATENT DOCUMENTS

| | | |
|---|---|---|
| CN | 1711649 | 12/2005 |
| JP | 09-232632 | 9/1997 |
| JP | 2005-064485 | 3/2005 |
| JP | 2009-200290 | 9/2009 |
| KR | 10-0551364 | 2/2006 |
| KR | 10-0849737 | 8/2008 |
| KR | 10-2009-0115314 | 11/2009 |
| KR | 10-2009-0115322 | 11/2009 |

OTHER PUBLICATIONS

English Translation of Written Opinion dated Mar. 27, 2012 issued to related International Application No. PCT/KR2011/005796.

* cited by examiner (a) As deposited (b) After N₂ Heat treatment at 400°C for 60 minutes (a) As deposited (b) After N₂ Heat treatment at 400°C for 60 minutes

SEMICONDUCTOR LIGHT EMITTING DIODE HAVING OHMIC ELECTRODE STRUCTURE AND METHOD OF MANUFACTURING THE SAME

CROSS-REFERENCE TO RELATED APPLICATIONS

This application is the National Stage Entry of International Application No. PCT/KR2011/005796, filed on Aug. 9, 2011 and claims priority from and the benefit of Korean Patent Application No. 10-2010-0078115, filed on Aug. 13, 2010, which are hereby incorporated by reference for all purposes as if fully set forth herein.

BACKGROUND

1. Field

The present invention relates to a semiconductor light emitting diode and a method of manufacturing the same, and more particularly, to a semiconductor light emitting diode including an ohmic electrode structure on a semiconductor layer of a light emitting structure to connect an external power source and a method of manufacturing the same.

2. Discussion of the Background

A semiconductor light emitting diode (LED) has a long lifespan, is small and lightweight, shows strong directivity of light, and can be driven at low voltage. In addition, a semiconductor light emitting diode (LED) is resistant to impact and vibration, does not require preheating and a complex driving circuit, and may be packaged in various forms. In particular, a nitride semiconductor light emitting diode allows an optical output having a wide wavelength band ranging from an ultraviolet region to a blue/red region due to a large energy band gap and has been being spotlighted to realize high efficiency and high output due to excellent physical/chemical stability thereof. Such a nitride semiconductor light emitting diode can be combined with existing red and green light emitting diodes to emit white light, and it is considered that the nitride semiconductor light emitting diodes will replace existing white light sources, such as incandescent, fluorescent, and mercury lamps, in the near future.

However, current nitride semiconductor light emitting diodes are not satisfactory in terms of optical output, luminous efficacy, and price, and their performance needs to be further improved. In particular, since current nitride semiconductor light emitting diodes still achieve low optical output as compared with existing white light sources, it is necessary to improve optical output and overcome thermal stability problems.

Meanwhile, a general nitride semiconductor light emitting diode is manufactured by forming a nitride n-type layer, a nitride active layer, and a nitride p-type layer on a sapphire substrate and horizontally disposing two electrodes to connect a power source to the n-type layer and the p-type layer. The horizontal light emitting diode can be manufactured by a relatively simple process and thus has an advantage of low manufacturing costs. However, the horizontal light emitting diode employs a sapphire substrate, which is nonconductive and has poor thermal conductivity, it requires application of a large area current for realization of a high output and suffers from low thermal stability due to accumulation of heat.

In order to overcome such drawbacks, a vertical semiconductor light emitting diode and a flip chip-type semiconductor light emitting diode have been suggested. In these diodes, a reflective layer is formed in a p-type electrode to allow light created by an active layer to be emitted to the outside through an n-type electrode, and a metal substrate having a good thermal conductivity is used instead of a sapphire substrate, thereby enabling application of a large area current and prompt discharge of heat to realize high output while securing thermal stability. Since vertical semiconductor light emitting diodes can achieve a maximum application current that is more than several times that of horizontal light emitting diodes, it is widely held that existing white light sources will be supplanted by high-output vertical semiconductor light emitting diodes in the future.

Meanwhile, it is necessary for an n-type electrode to have low resistance in order to improve operating voltage characteristics in a vertical semiconductor light emitting diode. For the vertical semiconductor light emitting diode, a metal substrate or a semiconductor substrate formed of Si, Ge, or the like is used and a sapphire substrate is removed through a laser lift-off (LLO) process, in which case high temperature heat treatment cannot be easily performed after the laser lift-off process due to a wafer bonding temperature and a large difference between thermal expansion coefficients of the metal substrate and the GaN thin film. Thus, Ti/Al n-type ohmic electrodes that can be formed at room temperature without any heat treatment have been widely used.

However, in the ohmic electrode, ohmic characteristics deteriorate due to heat generated upon heat treatment for forming a $SiO_2$ protective film after formation of the electrodes or upon application of high current to a large area light emitting diode, thereby causing increase in operating voltage. Thus, there is an urgent need for an n-type ohmic electrode that exhibits low contact resistance after deposition while ensuring excellent thermal stability so as to maintain low contact resistance even after heat treatment.

SUMMARY OF THE INVENTION

Exemplary embodiments of the invention provide a multi-layered ohmic electrode structure that exhibits excellent thermal stability and less deterioration of ohmic characteristics even in a high temperature environment, and a method of manufacturing the same Additional features of the invention will be set forth in the description which follows and in part will be apparent from the description, or may be learned by practice of the invention.

In accordance with one aspect of the invention, a semiconductor light emitting diode includes a light emitting structure having an upper surface constituting an N-face; and an ohmic electrode structure located on the light emitting structure. Here, the ohmic electrode structure includes: a contact layer located on the N-face of the light emitting structure; an Al protective layer located on the contact layer; a lower diffusion preventing layer interposed between the contact layer and the N-face of the light emitting structure; and an upper diffusion preventing layer interposed between the contact layer and the Al protective layer.

The lower diffusion preventing layer may include at least one of Mo and W, the contact layer may include at least one of Ti, TiN, Ti—Ni alloys, Ta, and W—Ti alloys, and the upper diffusion preventing layer may include a metal layer formed of at least one of W, Cr, Ru, Pt, Ni, Pd, Ir, Rh, and Nb, or may include an oxide film formed of at least one of RuOx, NiOx, IrOx, RhOx, NbOx, TiOx, TaOx, CrOx, and WOx.

The lower diffusion preventing layer stabilizes an ohmic electrode by preventing diffusion of a semiconductor component, for example, Ga, from a gallium nitride-based semiconductor layer to the ohmic electrode structure. The lower diffusion preventing layer may include a Mo layer or a W layer. Advantageously, the lower diffusion preventing layer is a W layer in terms of contact resistance.

In addition, the upper diffusion preventing layer prevents diffusion of a metal element, particularly Al, between the contact layer and the Al protective layer, thereby preventing the metal element of the protective layer from being mixing with the contact layer. As a result, it is possible to prevent deterioration of ohmic contact by preventing Al element of the protective layer from diffusing into the interface between the ohmic electrode structure and the light emitting structure.

In some embodiments, the lower diffusion preventing layer may include W and the contact layer may include Ti. In addition, the upper diffusion preventing layer may include W. In a specific embodiment, the contact layer may include Ti and the upper diffusion preventing layer may include W.

The lower diffusion preventing layer may have a thickness ranging from 1 Å to 10 Å, and the contact layer may have a thickness ranging from 10 Å to 50 Å. Further, the upper diffusion preventing layer may have a thickness ranging from 100 Å to 1000 Å.

The light emitting structure may include an n-type semiconductor layer, an active layer, and a p-type semiconductor layer. These semiconductor layers may be formed of a gallium nitride-based compound semiconductor. The ohmic electrode structure may be formed on the n-type semiconductor layer, without being limited thereto. Alternatively, the ohmic electrode structure may be formed on the p-type semiconductor layer.

In accordance with another aspect of the invention, a method of manufacturing a semiconductor light emitting diode includes: forming a light emitting structure having an upper surface constituting an N-face; and forming an ohmic electrode structure including a lower diffusion preventing layer, a contact layer, an upper diffusion preventing layer, and an Al protective layer on the N-face of the light emitting structure.

The lower diffusion preventing layer may include at least one of Mo and W, the contact layer may include at least one of Ti, TiN, Ti—Ni alloys, Ta, and W—Ti alloys, and the upper diffusion preventing layer may include a metal layer formed of at least one of W, Cr, Ru, Pt, Ni, Pd, Ir, Rh, and Nb, or may include an oxide film formed of at least one of RuOx, NiOx, IrOx, RhOx, NbOx, TiOx, TaOx, CrOx, and WOx (where x is the ratio of oxygen to a metal element and represents whether stoichiometric ratio is satisfied or oxygen is deficient. For example, x ranges from 0.1 to 1)

In some embodiments, the lower diffusion preventing layer may include W and the contact layer may include Ti. In addition, the upper diffusion preventing layer may include W.

The method may further include surface-treating the light emitting structure before forming the ohmic electrode structure. The surface treatment may include dipping the surface of the light emitting structure in aqua regia, followed by washing the surface of the light emitting structure using deionized water, and drying the surface of the light emitting structure using nitrogen.

The method may further include heat-treating the ohmic electrode structure. The heat treatment may be performed at a temperature of 150° C. to 600° C., and preferably, 400° C. to 600° C.

Since the semiconductor light emitting diode according to the present invention employs a multilayered ohmic electrode structure including a lower diffusion preventing layer, a contact layer, an upper diffusion preventing layer, and an Al protective layer, the lower diffusion preventing layer mitigates deterioration of an N-face semiconductor. Further, an upper diffusion preventing layer is disposed between the contact layer and the protective layer so as to prevent diffusion of Al elements in the protective layer. Accordingly, since the contact layer acts as a diffusion barrier layer of a metal of the protective layer, deterioration of contact resistance due to nitrogen atmosphere heat treatment and heat generated under a high current injection condition such as for a high output light emitting diode can be restrained, making it possible to maintain thermal stability.

Further, according to the present invention, the semiconductor light emitting diode employs the multilayered ohmic electrode structure including a lower diffusion preventing layer, a contact layer, a diffusion preventing layer and an Al protective layer, and thus has lower operating voltage characteristics, thereby further improving operation reliability.

BRIEF DESCRIPTION OF THE DRAWINGS

FIG. 8 shows scanning electron micrographs of a Ti/Al ohmic electrode structure according to the related art, in which FIG. 8A is a scanning electron micrograph immediately after deposition and FIG. 8B is a scanning electron micrograph immediately after heat treatment.

FIG. 9 shows scanning electron micrographs of a W/Ti/W/Al ohmic electrode structure according to the present invention, in which FIG. 9A is a scanning electron micrograph immediately after deposition and FIG. 9B is a scanning electron micrograph immediately after heat treatment.

DETAILED DESCRIPTION OF THE ILLUSTRATED EMBODIMENTS

Figure 1:
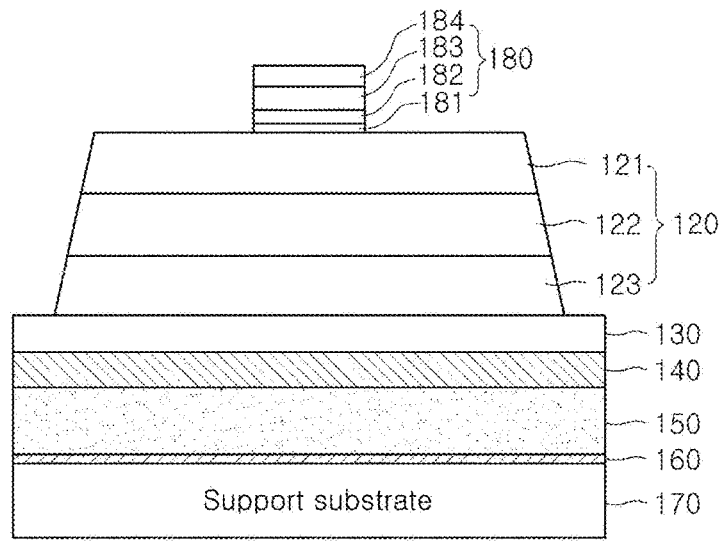
FIG. 1 is a sectional view of a semiconductor light emitting diode according to a first embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements. It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a sectional view of a semiconductor light emitting diode according to a first embodiment of the present invention.

Referring to FIG. 1, a semiconductor light emitting diode according to the first embodiment includes a light emitting structure 120, which includes an n-type semiconductor layer 121, an active layer 122, and a p-type semiconductor layer 123; an n-type electrode 180 formed on an upper surface of the n-type semiconductor layer 121; and a p-type electrode 130 formed on a lower surface of the p-type semiconductor layer 123. The semiconductor light emitting diode may further include a support substrate 170 attached to a lower surface of the p-type type electrode 130. Here, the n-type electrode 180 has a multilayered structure, which includes a lower diffusion preventing layer 181, a contact layer 182, a diffusion preventing layer 183, and a protective layer 184 formed sequentially on the light emitting structure 120, and is an ohmic electrode structure which makes ohmic contact with the light emitting structure 120.

The light emitting structure 120 includes the n-type semiconductor layer 121, the active layer 122, and the p-type semiconductor layer 123. Each of the n-type semiconductor layer 121, the active layer 122, and the p-type semiconductor layer 123 may be formed of gallium nitride semiconductor layer, for example, at least one of a GaN layer, AlN layer, InGaN layer, AlGaN layer, AlInGaN layer, and a film comprising these material layers. For example, the n-type semiconductor layer 121 and the p-type semiconductor layer 123 may be formed of GaN, and the active layer 122 may be formed of InGaN.

In general, an upper surface of an n-type semiconductor layer on which an ohmic electrode structure is formed is a Ga-face in a general horizontal light emitting structure. However, in the embodiments of the present invention, an ohmic electrode structure, that is, an upper surface of the light emitting structure 120 on which the n-type electrode 180 is formed, i.e. an upper surface of the n-type semiconductor layer 121, is an N-face.

Here, the n-type semiconductor layer 121 is a layer that provides electrons, and may include an n-type contact layer and an n-type clad layer. The n-type contact layer and the n-type clad layer may be formed by injecting n-type dopants, for example, Si, Ge, Se, Te, and C, into the above-mentioned semiconductor thin film. The p-type semiconductor layer 123 is a layer that provides holes, and may include a p-type contact layer and a p-type clad layer. The p-type contact layer and the p-type clad layer may be formed by injecting p-type dopants, for example, Mg, Zn, Be, Ca, Sr, and Ba into the above-mentioned semiconductor thin film.

The active layer 220 is a layer that outputs light of a predetermined wavelength through combination of electrons supplied from the n-type semiconductor layer 210 and holes supplied from the p-type semiconductor layer 230, and a multilayered semiconductor thin film having a single or multi-quantum well structure may be formed by alternately stacking a well layer and a barrier layer. Since a wavelength of output light varies according to a semiconductor material forming the active layer 220, a suitable semiconductor material is selected according to a target output wavelength. For example, in the present embodiment, the light emitting structure 120 is formed by forming the n-type GaN semiconductor layer 121, alternately depositing a GaN thin film as a barrier layer and an InGaN thin film as a well layer on the n-type GaN semiconductor layer 121 to form the active layer 122 having a multi-quantum well structure, and growing the p-type GaN semiconductor layer 123 on the active layer 122.

The n-type electrode 180 and the p-type electrode 130 are disposed vertically, and the p-type electrode 130 forms a reflective surface that reflects light produced in the active layer 122 so that most of light can be irradiated to the outside through the n-type semiconductor layer 121. The n-type electrode 180 is a multilayered ohmic electrode structure, which includes a lower diffusion preventing layer 181, a contact layer 182, an upper diffusion preventing layer 183, and an Al protective layer 184. Then, the lower diffusion preventing layer 181 may include at least one of Mo and W, and for example, may be formed of a Mo layer or a W layer. The contact layer 182 may include at least one of Ti, TiN, Ti—Ni alloys, Ta, and W—Ti alloys, and the upper diffusion preventing layer may include a layer formed of at least one metal including W, Cr, Ru, Pt, Ni, Pd, Ir, Rh, and Nb, or includes an oxide film formed of at least one of RuOx, NiOx, IrOx, RhOx, NbOx, TiOx, TaOx, CrOx, and WOx (where x is a ratio of oxygen to a metal element and represents whether stoichiometric ratio is satisfied or oxygen is deficient. For example, x ranges from 0.1 to 1). For example, in the n-type electrode 180 of the present embodiment, the lower diffusion preventing layer 181 is a W layer, the contact layer 182 is a Ti layer, the diffusion preventing layer 183 is a W layer, and the protective layer 184 is an Al layer.

The support substrate 170 serves to support the entire structure 120, 130, and 180 as a growth substrate of the light emitting structure 120, that is, a mother substrate, is removed. A protective layer 160, a bonding layer 150, and a diffusion layer 140 may be formed between the support substrate 170 and the p-type electrode 130 such that the support substrate 170 may be attached to a lower surface of the p-type electrode 130. The diffusion preventing layer 140 is used to prevent a forming material 120 of the p-type electrode 130 from being diffused to an adjacent layer due to heat during a bonding process of the p-type electrode 130 and the support substrate 170.

Hereinafter, a process of manufacturing the light emitting device will be described with reference to FIGS. 2 to 5. Here, FIGS. 2 to 5 are sectional views of a process of manufacturing the light emitting diode according to the first embodiment of the present invention.

Figure 2:
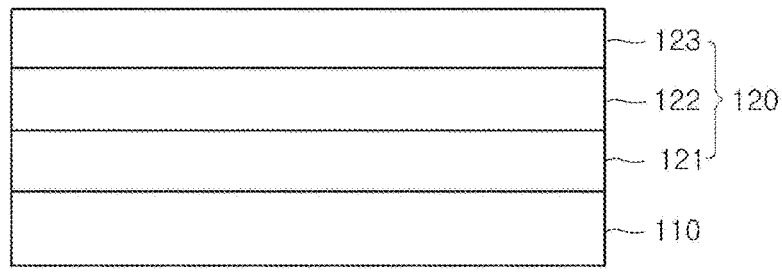
FIGS. 2 to 5 are sectional views of a process of manufacturing the light emitting diode according to the first embodiment of the present invention.

Referring to FIG. 2, an n-type semiconductor 121, an active layer 122, and a p-type semiconductor layer 123 are sequentially stacked on a prepared substrate 110 to form a multilayered light emitting structure 120. The substrate 110 may be a sapphire ($Al_2O_3$) substrate, a silicon carbide (SiC) substrate, a silicon (Si) substrate, a zinc oxide (ZnO) substrate, a gallium arsenide (GaAs) substrate, or a gallium phosphide (GaAs) substrate, and in particular, a sapphire substrate is preferred. Then, an upper surface of the light emitting structure 120 is formed to have a Ga-face.

Figure 3:
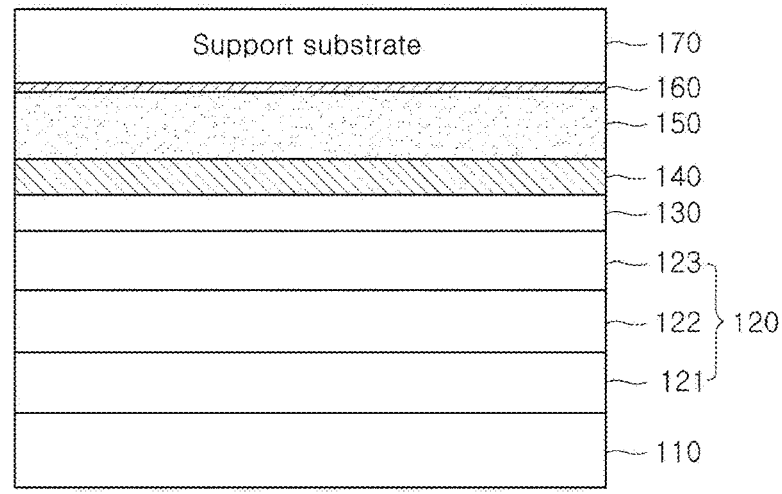

Referring to FIG. 3, a p-type electrode 130 is formed by depositing a metal film on the light emitting structure 120, and after a diffusion preventing layer 140, a bonding layer 150, and a protective layer 160 are sequentially formed on the p-type electrode 130, the light emitting structure 120 is attached to a support substrate 170 through a bonding process. A heating/bonding process may be performed for attachment of the support substrate 170, and the diffusion preventing layer 140 prevents a forming material of the p-type electrode 130 from being diffused in the heating process. Meanwhile, the p-type electrode 130 is preferably formed of a reflective conductive film, such as an Ag film or an Au film, which has excellent light reflectivity, such that most light produced in the active layer 122 can be emitted in a direction of the n-type semiconductor layer 123, and the support substrate 170 is preferably a metal substrate, or a semiconductor substrate of Si, Ge, or the like.

Figure 4:
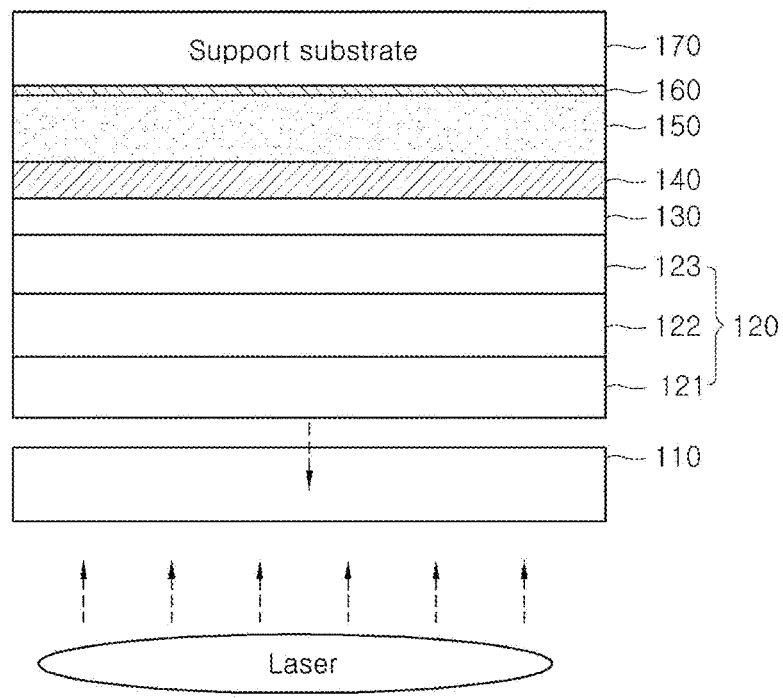

Referring to FIG. 4, a mother substrate 110 is separated and removed by a laser lift-off process. Accordingly, the N-face of the light emitting structure 120 is exposed.

Figure 5:
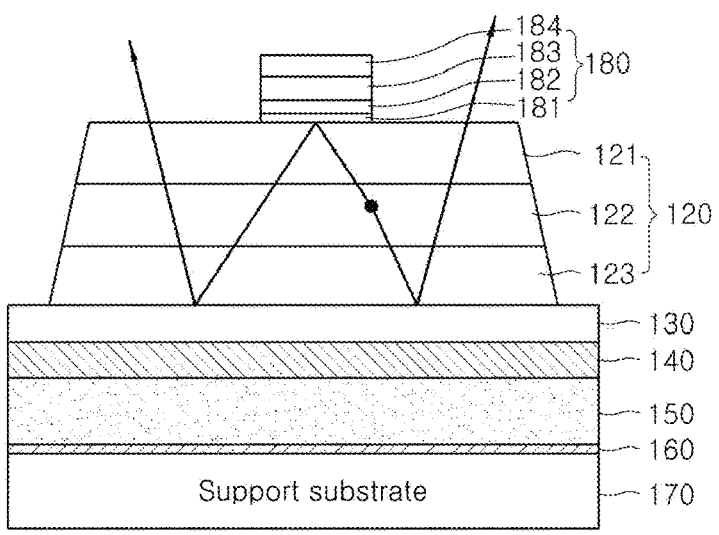

Next, referring to FIG. 5, after the support substrate 110 is overturned to face downward and the light emitting structure 120 is mesa-etched, the light emitting structure 120 is surface treated to increase an interface bonding force of the light emitting structure 120 with an n-type electrode 180, which will be subsequently formed. For example, a surface of the light emitting structure, that is, the n-type semiconductor layer 123, is subjected to primary surface treatment in such a way that the n-type semiconductor layer 123 is dipped in aqua regia ($HCl:H_2O=3:1$) for about 10 minutes, is washed with deionized water, is dried using nitrogen, and is subjected to secondary surface treatment in such a manner that the n-type semiconductor layer 123 is dipped in a solution in which hydrochloric acid (HCl) and deionized water are mixed in a ratio of 1:1 for about 2 minutes and is dried before the other layer, that is, the n-type electrode 123 is deposited. The primary and second surface treatments may be selectively performed according to a desired purpose, or may be omitted.

Referring back to FIG. 5, a lower diffusion preventing layer 181, a contact layer 182, an upper diffusion preventing layer 183, and an Al protective layer 184 are sequentially stacked on the N-face of the light emitting structure 120, that is, the n-type semiconductor layer 123 to form an n-type electrode 180. For example, the lower diffusion preventing layer 181 may be formed of W, the contact layer 182 may be formed of Ti, and the upper diffusion preventing layer 183 may be formed of W. The W lower diffusion preventing layer 181 is formed to a thickness of 1 Å to 10 Å. If the thickness of the lower diffusion preventing layer 181 is 1 Å or less, it is difficult to prevent diffusion of a semiconductor material due to thermal energy, and if the thickness of the lower diffusion preventing layer 181 is 10 Å or more, injection of electrons is blocked. The Ti contact layer 182 is formed to a thickness ranging 10 Å to 50 Å. If the thickness of the contact layer 182 is 10 Å or less, it has difficulty functioning as a contact layer, and if the thickness of the contact layer is 50 Å or more, the thin film undergoes increased an electron injection barrier can increase due to increase in thickness, causing increase in an electron injection barrier. The W diffusion preventing layer 183 is formed to a thickness ranging 100 Å to 1000 Å. If the thickness of the diffusion preventing layer 183 is 100 Å or less, the diffusion preventing layer cannot function properly, and if the thickness of the diffusion preventing layer 1000 Å or more, its electrical characteristics can deteriorate due to increase in resistance. An Al protective layer 184 is formed on the W diffusion preventing layer 183. For example, the W lower diffusion preventing layer, the Ti contact layer, the W upper diffusion preventing layer, and the Al protective layer are sequentially formed on the light emitting structure 120 to have thicknesses of 10 Å, 50 Å, 100 Å, and 2000 Å, respectively, by sputtering.

Then, after the n-type electrode 180 is formed to improve bonding force between the ohmic electrode and the substrate, improve ohmic characteristics, and secure thermal reliability, heat treatment may be performed at temperatures of 150° C. to 600° C., and preferably, 400° C. to 600° C. in an atmosphere containing nitrogen.

Meanwhile, an inventive example and a comparative example will be described below to identify characteristics of the n-type electrode 180 making ohmic contact with the light emitting structure 120 in the semiconductor light emitting diode according to the first embodiment of the invention. In the inventive example, a W/Ti/W/Al ohmic electrode structure according to the present invention was used, and in the comparative example, an existing general Ti/Al ohmic electrode structure was used.

Figure 6:
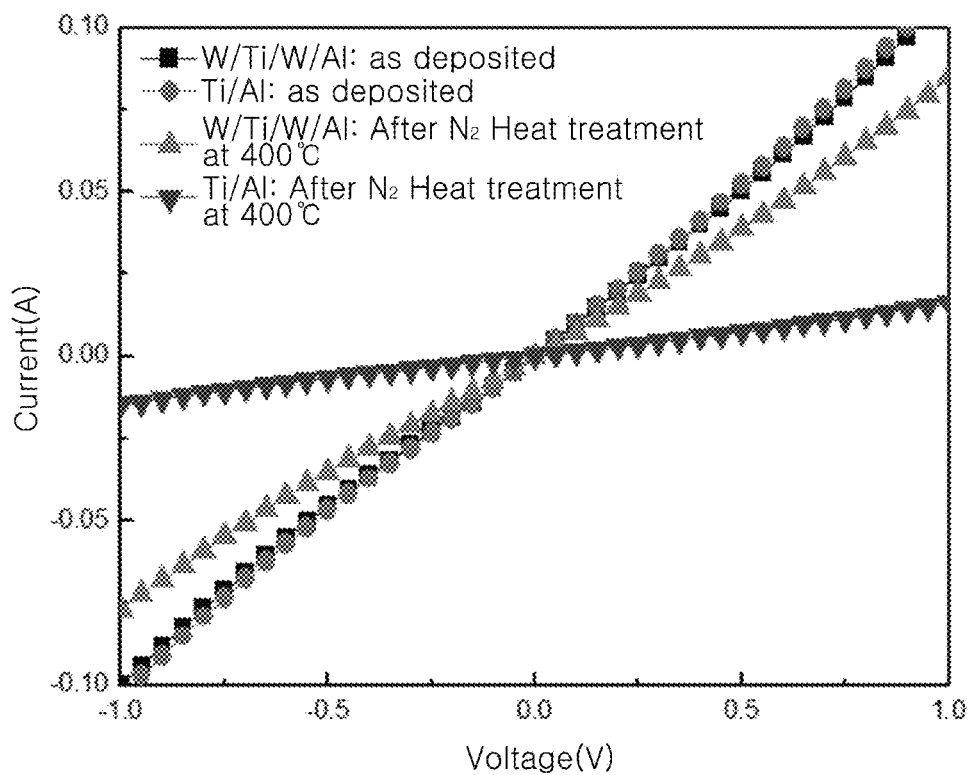
FIG. 6 is a graph depicting current-voltage characteristics of ohmic electrode structures according to an inventive example and a comparative example.

FIG. 6 is a graph depicting current-voltage characteristics of ohmic electrode structures according to an inventive example and a comparative example, obtained by measuring current-voltage characteristics immediately after deposition and after heat treatment for 1 minute in a nitrogen atmosphere at about 400° C.

Referring to FIG. 6, the W/Ti/W/Al ohmic electrode prepared in the inventive example and the Ti/Al ohmic electrode prepared in the comparative example provide similar current-voltage curves immediately after deposition. However, immediately after heat treatment, the Ti/Al electrode structure exhibited ohmic characteristics in which a current-voltage curve deteriorates considerably, whereas the W/Ti/W/Al ohmic electrode structure substantially maintained the current-voltage curve immediately after deposition even after heat treatment. A reciprocal of the inclination (I/V) of the current-voltage curve refers to a resistance (R), and it can be seen that the W/Ti/W/Al ohmic electrode of the inventive example underwent a smaller resistance change that the existing Ti/Al ohmic electrode of the comparative example, showing more excellent thermal stability. Thus, since the W/Ti/W/Al ohmic electrode of the inventive example maintained low-resistance ohmic characteristics even in a high temperature environment due to its high thermal stability, a high current can be applied to the semiconductor layer, further increasing optical output of the light emitting device.

Figure 7:
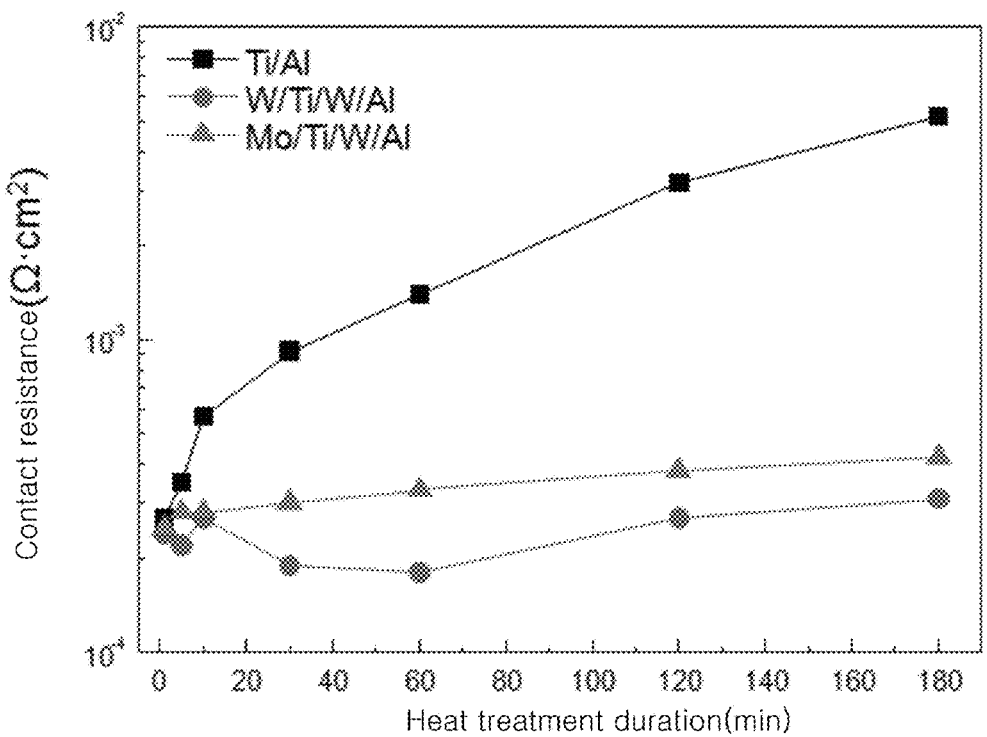
FIG. 7 is a graph depicting contact resistance changes of the ohmic electrode structures according to the inventive example and the comparative example.

FIG. 7 is a graph depicting contact resistance changes of the ohmic electrodes according to the inventive example and the comparative example, obtained by calculating a contact resistance change after a heat treatment temperature is fixed at 400° C. in a nitrogen atmosphere and while heat treatment duration varies.

In order to identify electrical characteristics of an ohmic electrode, a TLM method suggested by Schottky was used to calculate contact resistance. In the TLM method, resistance ($R_T$) at 0 V was obtained by measuring current (I)-voltage (V) curves between two metal electrodes whose distances are divided into $d_1$, $d_2$, $d_3$, and $d_4$. Contact resistance may be calculated through the following equations by drawing a graph based on the resistance $R_T$ measured along distances and extrapolating.

$$R_T = \frac{R_S d}{Z} + 2R_C [\Omega] \qquad \text{[Equation 1]}$$

$$r_C = R_C \times Z(\mu m) \times 10^{-4} [\Omega] \qquad \text{[Equation 2]}$$

$$\rho_C = \frac{r_C^2}{R_S} [\Omega\ cm^2] \qquad \text{[Equation 3]}$$

(where $R_T$ denotes a resistance [$\Omega$] between metal electrodes, $R_S$ denotes a surface resistance [$\Omega$] of a semiconductor layer, d denotes a distance between metal electrodes, Z denotes a width of a metal electrode, and $\rho_C$ denotes a contact resistance.)

Referring to FIG. 7, the W/Ti/W/Al ohmic electrode structure according to the inventive example showed a low contact resistance value of $1.5\times10^{-4}$ $\Omega cm^2$ and the Ti/Al ohmic electrode structure according to the comparative example showed a slightly higher contact resistance value of $1.8\times10^{-4}$ $\Omega cm^2$, right after the temperature is increased to 400° C. However, when heat treatment continued for 180 minutes, the contact resistance of the Ti/Al ohmic electrode structure according to the comparative example abruptly increased to $5.8\times10^{-2}$ $\Omega cm^2$, but the W/Ti/W/Al ohmic electrode structure according to the inventive example still maintained a low contact resistance value of $2.0 \times 10^{\times 4}$ $\Omega cm^2$. Through the result, it can be seen that the W/Ti/W/Al ohmic electrode structure according to the inventive example has a more excellent thermal stability than the existing Ti/Al ohmic electrode structure.

Further, the Mo/Ti/W/Al ohmic electrode structure according to another inventive example of the present invention showed a contact resistance value similar to that of the W/Ti/W/Al ohmic electrode structure right after the temperature is increased to 400° C., showed a contact resistance value slightly higher than that of the W/Ti/W/Al ohmic electrode structure when heat treatment continued for 180 minutes, and showed a contact resistance value slightly increased according to heat treatment duration. The Mo/Ti/W/Al ohmic electrode structure showed very stable contact resistance over according to heat treatment duration.

Figure 8:
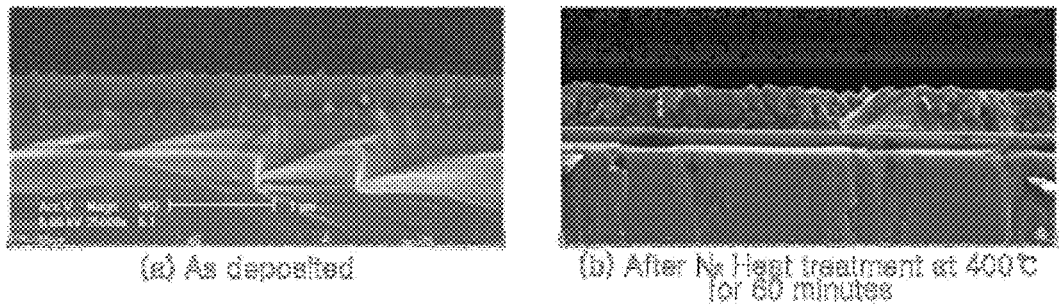

FIG. 8 shows results obtained by observing sections of the Ti/Al ohmic electrode structure according to the comparative example using a scanning electron microscope (SEM) before heat treatment and after heat treatment at 400° C. for 60 minutes. It can be seen that since the Ti/Al ohmic electrode structure did not have good thermal stability, a solid solution was newly formed while an interface of an electrode collapsed.

The reason for deterioration of contact resistance characteristics due to collapse of an interface of Ti/Al is not definitively known, but it is considered that AlN is formed when some Al is moved to an interface of Ti and an n-type semiconductor layer while Al of the protective layer forms a solid solution with Ti of the contact layer.

"Interfacial Band Bendings in Al Ohmic Contacts to Laser-Irradiated Ga-Face and N-Face n-GaN", Electrochemical and Solid-State Letters, 12(11), H405-H407, Aug. 20, 2009) written by the present inventors discloses a contact resistance change after Al is deposited on the Ga-face and the N-face and is heat treated. When heat treatment is performed at temperatures of 400° C. to 600° C., contact resistance characteristics do not deteriorate on the Ga-face, but contact resistance of the N-face increases as the heat treatment temperature increases. That is, even when Al is deposited on the GaN layer of the same material and is heat treated, contact resistance characteristics vary on the Ga-face and the N-face. The AlN formed on the Ga-face accumulates electrons at an interface with the GaN layer, increasing contact resistance, but AlN formed on the N-face accumulates holes at an interface with the GaN layer, thereby increasing contact resistance. Similarly, in the Ti/Al ohmic electrode structure, it is considered that Al elements of the protective layer are moved to an interface of Ti and the N-face nitride semiconductor layer to form AlN at the interface, and accordingly, the contact resistance characteristics deteriorate.

Figure 9:
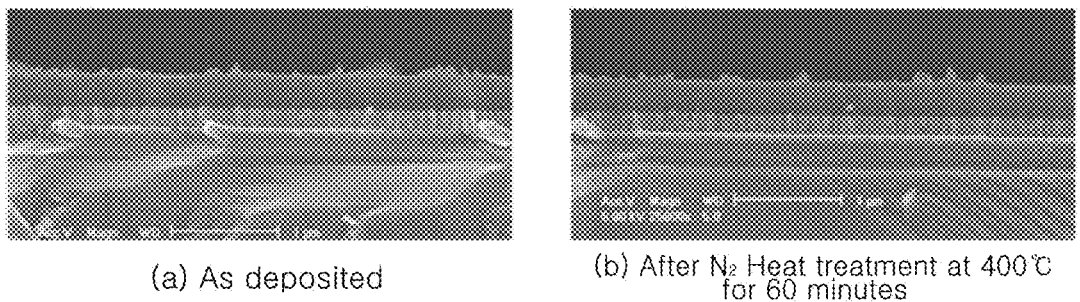

Meanwhile, FIG. 9 shows results obtained by observing sections of the W/Ti/W/Al ohmic electrode structure according to the inventive example using a scanning electron microscope (SEM) before heat treatment and after heat treatment at 400° C. for 60 minutes. It can be seen that the W/Ti/W/Al according to the inventive example maintained its interface even after heat treatment, and thus had high thermal stability. From this result, it is considered that W functions as a diffusion preventing layer of Al to prevent AlN from being formed on the N-face semiconductor layer, thereby preventing deterioration in contact resistance.

Figure 10:
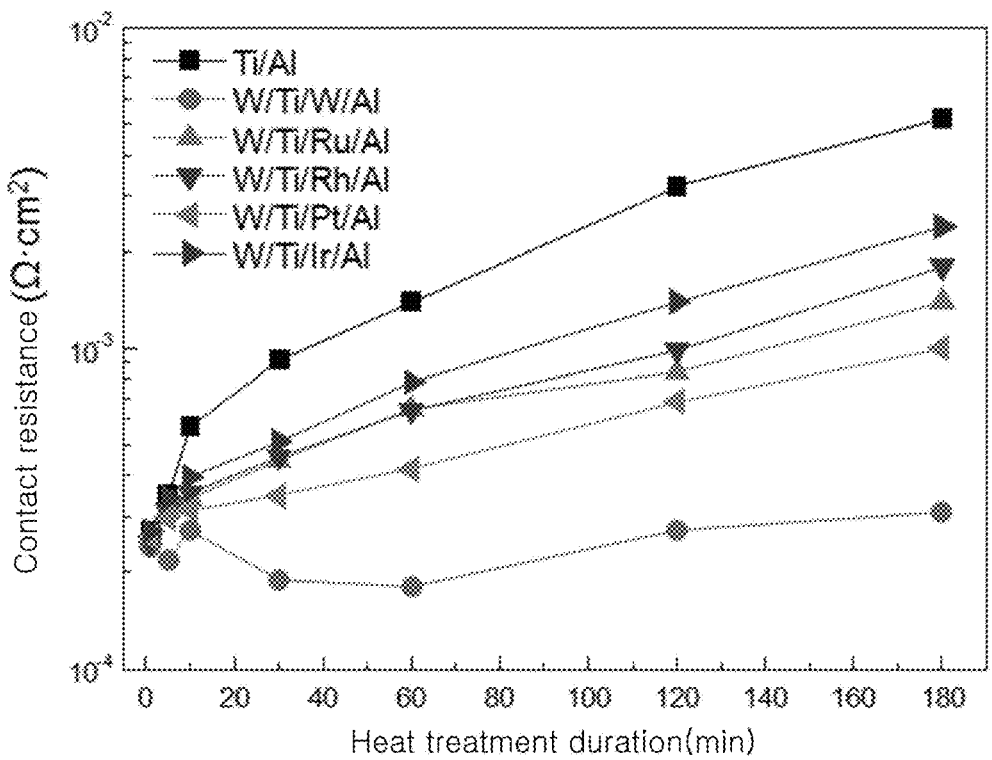
FIG. 10 is a graph depicting contact resistance changes of the ohmic electrode structures according to the inventive example and the comparative example.

FIG. 10 is a graph for explaining various inventive examples in which a lower diffusion preventing layer, a contact layer, and a protective layer are fixed by W, Ti, and Al and an upper diffusion preventing layer was formed of various metal layers.

Referring to FIG. 10, the examples in which the upper diffusion preventing layers were formed of W, Ru, Rh, Pt, and Ir showed lower contact resistance values than the existing ohmic electrode structure of Ti/Al. In particular, it can be seen that more excellent contact resistances can be obtained when the upper diffusion preventing layer is formed of W.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

The invention claimed is:

1. A semiconductor light emitting diode, comprising:
a light emitting structure comprising an upper surface comprising an N-face; and
an ohmic electrode structure arranged on the light emitting structure, the ohmic electrode structure comprising:
a contact layer arranged on the N-face of the light emitting structure;
a protective layer arranged on the contact layer;
a lower diffusion preventing layer disposed between the contact layer and the N-face of the light emitting structure; and
an upper diffusion preventing layer disposed between the contact layer and the protective layer,
wherein:
the lower diffusion preventing layer comprises at least one of Mo and W;
the contact layer comprises at least one of Ti, TiN, a Ti—Ni alloy, Ta, and a W—Ti alloy;
the upper diffusion preventing layer comprises a metal layer comprising at least one of W, Cr, Ru, Pt, Ni, Pd, Ir, Rh, and Nb, or an oxide film comprising at least one of RuOx, NiOx, IrOx, RhOx, NbOx, TiOx, TaOx, CrOx, and WOx; and
the protective layer comprises Al.

2. The semiconductor light emitting diode according to claim 1, wherein the lower diffusion preventing layer comprises a Mo layer or a W layer.

3. The semiconductor light emitting diode according to claim 1, wherein the contact layer comprises a Ti layer.

4. The semiconductor light emitting diode according to claim 1, wherein the contact layer comprises Ti and the upper diffusion preventing layer comprises W.

5. The semiconductor light emitting diode according to claim 1, wherein the lower diffusion preventing layer has a thickness of 1 Å to 10 Å.

6. The semiconductor light emitting diode according to claim 1, wherein the contact layer has a thickness of 10 Å to 50 Å.

7. The semiconductor light emitting diode according to claim 1, wherein the upper diffusion preventing layer has a thickness of 100 Å to 1000 Å.

8. The semiconductor light emitting diode according to claim 1, wherein the light emitting structure comprises an n-type semiconductor layer, an active layer, and a p-type semiconductor layer, and the ohmic electrode structure is arranged on the n-type semiconductor layer.

9. The semiconductor light emitting diode according to claim 8, further comprising an ohmic electrode contacting the p-type semiconductor layer.

10. The semiconductor light emitting diode according to claim 1, wherein the lower diffusion preventing layer contacts the N-face of the light emitting structure, the contact layer contacts the lower diffusion preventing layer, the upper diffusing preventing layer contacts the contact layer, and the Al protective layer contacts the upper diffusing preventing layer.

11. A method of manufacturing a semiconductor light emitting diode, the method comprising:
    forming a light emitting structure comprising an upper surface comprising an N-face; and
    forming an ohmic electrode structure on the N-face of the light emitting structure, the ohmic electrode structure comprising a lower diffusion preventing layer, a contact layer, an upper diffusion preventing layer, and a protective layer,
    wherein:
    the lower diffusion preventing layer comprises at least one of Mo and W;
    the contact layer comprises at least one of Ti, TiN, a Ti—Ni alloy, Ta, and a W—Ti alloy;
    the upper diffusion preventing layer comprises a metal layer formed of at least one of W, Cr, Ru, Pt, Ni, Pd, Ir, Rh, and Nb, or an oxide film formed of at least one of RuOx, NiOx, IrOx, RhOx, NbOx, TiOx, TaOx, CrOx, and WOx; and
    the protective layer is formed of Al.

12. The method according to claim 11, wherein the contact layer comprises Ti.

13. The method according to claim 12, wherein the upper diffusion preventing layer comprises W.

14. The method according to claim 11, further comprising: surface-treating the light emitting structure before forming the ohmic electrode structure.

15. The method according to claim 14, wherein the surface treatment comprises dipping a surface of the light emitting structure in aqua regia, followed by washing the surface of the light emitting structure using deionized water, and drying the surface of the light emitting structure using nitrogen.

16. The method according to claim 11, further comprising: heat-treating the ohmic electrode structure.

17. The method according to claim 16, wherein the heat treatment is performed at a temperature of 150° C. to 600° C.

18. The method according to claim 11, wherein forming the ohmic electrode structure comprises:
    forming the lower diffusion preventing layer on the N-face of the light emitting structure;
    forming the contact layer on the lower diffusion preventing layer;
    forming the upper diffusion preventing layer on the contact layer; and
    forming the protective layer on the upper diffusion preventing layer.

* * * * *